United States Patent
Kim et al.

[11] Patent Number: 6,086,960
[45] Date of Patent: *Jul. 11, 2000

[54] METHOD FOR IMPROVING THE QUALITY OF A TITANIUM NITRIDE LAYER INCLUDING CARBON AND OXYGEN

[75] Inventors: Jeong Tae Kim; Sung Bo Hwang, both of Kyoungkido, Rep. of Korea

[73] Assignee: Hyundai Electronics Industries Co., Ltd., Kyoungkido, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/889,091

[22] Filed: Jul. 7, 1997

Related U.S. Application Data

[63] Continuation of application No. 08/590,525, Jan. 24, 1996, abandoned.

[30] Foreign Application Priority Data

Mar. 28, 1995 [KR] Rep. of Korea .......................... 95-6706

[51] Int. Cl.[7] .......................... C23C 16/34; C23C 14/02; H05H 1/00
[52] U.S. Cl. .................. 427/534; 427/535; 427/255.394
[58] Field of Search ...................................... 427/533, 534, 427/535, 537, 530, 531, 564, 569, 576, 255.394

[56] References Cited

U.S. PATENT DOCUMENTS

| | | |
|---|---|---|
| 5,173,327 | 12/1992 | Sandhu et al. .......................... 427/573 |
| 5,175,126 | 12/1992 | Ho et al. .................................. 437/190 |
| 5,192,589 | 3/1993 | Sandhu .................................. 427/255.1 |
| 5,246,881 | 9/1993 | Sandhu et al. ........................... 427/573 |
| 5,273,783 | 12/1993 | Wanner .................................. 427/255.3 |
| 5,334,264 | 8/1994 | Meletis .................................... 427/570 |
| 5,364,522 | 11/1994 | Wang . |
| 5,376,590 | 12/1994 | Machida et al. . |
| 5,380,566 | 1/1995 | Robertson et al. . |
| 5,382,809 | 1/1995 | Nishibayashi et al. . |
| 5,480,684 | 1/1996 | Sandhu .................................... 427/531 |
| 5,487,922 | 1/1996 | Niel et al. ................................ 427/530 |
| 5,514,425 | 5/1996 | Ito et al. .................................. 427/534 |
| 5,576,071 | 11/1996 | Sandhu .................................... 427/533 |
| 5,747,116 | 5/1998 | Sharan et al. ........................... 427/535 |
| 5,834,068 | 11/1998 | Chern et al. ............................ 427/535 |
| 5,906,866 | 5/1999 | Webb ...................................... 427/534 |
| 5,972,179 | 10/1999 | Chittipeddi et al. ..................... 427/535 |
| 5,989,652 | 11/1999 | Ameen et al. .......................... 427/534 |

FOREIGN PATENT DOCUMENTS

| | | |
|---|---|---|
| 0446988 A1 | 9/1991 | European Pat. Off. . |
| 0630990A2 | 12/1994 | European Pat. Off. . |
| 3-135018 | 6/1991 | Japan . |
| 5-47707 | 2/1993 | Japan . |

*Primary Examiner*—Marianne Padgett
*Attorney, Agent, or Firm*—Jacobson, Price, Holman & Stern, PLLC

[57] ABSTRACT

The present invention is to provide a method for making a titanium nitride (TiN) layer, comprising the step of: forming the TiN layer out of a source materials; and exposing the TiN layer using the hydrogen and nitrogen plasma gases. Accordingly, the present invention has an effect that resistivity of the TiN layer decreases by eliminating the impurities therein and by decreasing the porosity thereof, and that the electrical stability of the TiN layer increases.

18 Claims, No Drawings

METHOD FOR IMPROVING THE QUALITY OF A TITANIUM NITRIDE LAYER INCLUDING CARBON AND OXYGEN

This is a continuation of Ser. No. 08/590,525, filed on Jan. 24, 1996, abandoned,

FIELD OF THE INVENTION

The present invention relates to a method for improving the quality of a titanium nitride (TiN) layer which is commonly used as an adhesion layer of tungsten and as a diffusion barrier layer in aluminum (Al) metallization processes, and more particularly, a method for removing carbon and oxygen atoms which exist in the TiN layer.

BACKGROUND OF THE INVENTION

Generally, in semiconductor manufacturing processes, the TiN layer has been widely used as a diffusion barrier layer and adhesion layer. The TiN layer is commonly formed by two methods, one of which is the physical vapor deposition method (hereinafter, referred to as the PVD method) and the other of which is the chemical vapor deposition method (hereinafter, referred to as the CVD method). However, the CVD method has been generally used for forming the TiN layer because of the excellent step-coverage.

The TiN layer is made by pyrolyzing source materials such as tetrakisdimethlyaminotitanum (TDMAT) and tetrakisdiethlyaminotitanum (TDEAT), and the TiN layer is porous.

However, since the TiN layer made by pyrolyzing includes carbide and oxide, it has high resistivity of about $10^4$ $\mu$ohm-cm or more. Also, when the TiN layer is exposed to the air, the TiN layer absorbs moisture and oxygen due to its porosity. In a case here the TiN layer is exposed for about twenty-four hours, the resistivity of an exposed TiN layer may be three and a half times higher than that of a TiN layer not exposed. Consequently, the quality of the TiN layer deteriorates.

SUMMARY OF THE INVENTION

An object of the present invention is to provide a method for decreasing the resistivity of the TiN layer which is exposed to the air, by eliminating impurities therein using plasma gases.

In accordance with an aspect of the present invention, there is provided a method for making a titanium nitride (TiN) layer, comprising the step of: forming the TiN layer out of source materials; and exposing the TiN layer using hydrogen and nitrogen plasma gases.

In accordance with another aspect of the present invention, there is provided a method for making a titanium nitride (TiN) layer, comprising the step of: forming the TiN layer out of source materials; and exposing the TiN layer using hydrogen plasma gas.

DETAILED DESCRIPTION OF THE INVENTION

Hereinafter, one embodiment of the present invention will be described below.

First, the TiN layer is formed using the CVD method by pyrolyzing TDMAT or TDEAT. Next, the primary plasma treatment is applied to the TiN layer using nitrogen and hydrogen gases. That is to say, the TiN layer is exposed to nitrogen and hydrogen gases.

In a preferred embodiment, the primary conditions are as follows:

1) the amount of the nitrogen gas: 100–500 sccm
2) the amount of the hydrogen gas: 100–500 sccm
3) the temperature: 200–500° C.
4) the pressure: 0.5–5 Torr
5) the RF power: 200–700 W
6) the processing time: 10–60 seconds At this time, the primary plasma treatment is performed without delay time in the chamber where the TiN layer is formed or in another chamber attendant on the exposure of the TiN layer to the air.

After primarily treating the TiN layer, the secondary plasma treatment is performed by the nitrogen gas.

In the preferred embodiment, the secondary treatment conditions are as follows:

1) the amount of the nitrogen gas: 100–500 sccm
2) the temperature: 200–500° C.
3) the pressure: 0.5–5 Torr
4) the RF power: 200–700 W
5) the processing time: 10–60 seconds The active hydrogen ions in the primary plasma treatment penetrate into the TiN layer, and dissociate the bonds of —C=N=C=N— and =C=O radicals which exist in the TiN layer, thereby forming a chemical combination with the dissociated carbon and oxygen atoms. On the other hand, the by-products formed by this chemical combination consist of $CH_4$ and $H_2O$ which are emanated.

Furthermore, the active nitrogen ions prevent the oxygen ions, which exist in the processing chamber, from being absorbed in the TiN layer, and occupy the vacancies which are formed by emanation of $CH_4$ and $H_2O$.

Next, the secondary plasma treatment is applied to the TiN layer to which the primary plasma treatment has been applied, such that the occupation of nitrogen is maximized in the TiN layer.

As a result, a number of combinations between titanium and nitrogen can be achieved by plasma treatment. Accordingly, the density of the TiN layer to which the plasma treatments are applied is denser than that of the TiN layer to which the plasma treatments are not applied so that a TiN layer having low resistivity can be achieved by the plasma treatments.

Table <1> shows the variation of the resistivity of the TiN layer depending on the exposure time in the air in the case where the TiN layer is formed.

TABLE 1

| | resistivity of the TiN layer | |
|---|---|---|
| exposure time to the air | resistivity ($\mu$ohm-cm) NO plasma treatment | resistivity ($\mu$ohm-cm) plasma treatment |
| 0 hour | 19706 | 2714 |
| 22 hours | 70044 | 3922 |
| 47 hours | 93376 | 4249 |
| 73 hours | 112009 | 4444 |
| *1st plasma treatment: | *2nd plasma treatment | |
| 1) temperature: 450° C. | 1) temperature: 450° C. | |
| 2) pressure: 2 Torr | 2) pressure: 2 Torr | |
| 3) RF power: 350 W | 3) RF power: 350 W | |
| 4) hydrogen: 200 sccm | 4) nitrogen: 300 sccm | |
| 5) nitrogen: 300 sccm | 5) time: 30 seconds | |
| 6) time: 30 seconds | | |

Also, in table <1>, the secondary treatment conditions are the same as the primary treatment conditions except for using only the nitride plasma gas whose amount is 300 sccm.

As shown in table <1>, the resistivity of the TiN layer is considerably decreased.

Furthermore, table <2> shows the difference in stress and table <3> shows the reduction of oxygen and carbon atoms in the TiN layer.

TABLE 2 stress of the TiN layer

|  | no plasma treatment | | plasma treatment | |
|---|---|---|---|---|
| delay time | 0 hour | 24 hours | 0 hour | 24 hours |
| stress (dyne/cm$^2$) | −9.00 E + 8 | −1.30 E + 9 | −6.70 E + 9 | −7.70 E + 9 |
| stress(%) | 44% | | 15% | |

TABLE 3 composition of the TiN layer

|  | no plasma treatment (at %) | plasma treatment (at %) |
|---|---|---|
| Ti | 37 | 45 |
| C | 29 | 18 |
| N | 21 | 27 |
| O | 13 | 10 |

Another embodiment of the present invention will be described below.

The primary plasma treatment having only one of the nitrogen and hydrogen gases is applied to the TiN layer which is formed by pyrolyzing TDMAT or TDEAT. At this time, all the treatment conditions are the same as those of the above-mentioned embodiment.

Of course, only one of the two step treatments can be used according to characteristics of the TiN layer.

As stated above, the present invention has an effect that resistivity of the TiN layer decreases by eliminating the impurities therein and by decreasing the porosity thereof. Accordingly, the present invention can increase the electrical stability of the TiN layer.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for making a titanium nitride (TiN) layer used in manufacturing of a semiconductor device, comprising steps of:

forming a single TiN layer out of source material, wherein the TiN layer contains impurities of carbon (c) and oxygen (o) atoms; and exposing the single TiN layer to hydrogen and nitrogen plasma gases so that the hydrogen plasma gas reacts with the carbon and oxygen atoms contained in the TiN layer, to form $CH_4$ and $H_2O$ from the C and O atoms which are emanated from the TiN layer, and enabling nitrogen atoms to occupy spaces left in the TiN layer by the emanation of the $CH_4$ and $H_2O$, thereby preventing oxygen ions from being absorbed into the TiN layer;

wherein the step of exposing the TiN layer is carried out in a chamber having a temperature in a range of 200–500° C., a pressure in a range of 3–5 Torr, and a radio frequency power in a range of 200–700 W; and subsequently exposing the TiN layer using a second nitrogen plasma gas.

2. A method in accordance with claim 1, wherein a flow rate of the hydrogen and nitrogen plasma gases in the exposing step is 100–500 sccm.

3. A method in accordance with claim 1, wherein the step of exposing the TiN layer is performed for 10–60 seconds.

4. A method in accordance with claim 1, wherein the step of subsequently exposing the TiN layer using the second nitrogen plasma gas is performed in the chamber having a second temperature in a range of 200–500° C., a second pressure in a range of 3–5 Torr, and a second radio frequency power in a range of 200–700 W.

5. A method in accordance with claim 1, wherein a flow rate of the second nitrogen plasma gas in the subsequently exposing step is 100–500 sccm.

6. A method in accordance with claim 1, wherein the step of subsequently exposing the TiN layer is performed for 10–60 seconds.

7. A method in accordance with claim 1, wherein the source material is tetrakisdimethlylamidotitanum (TDMAT) or tetrakisdiethlyaminotitanum (TDEAT).

8. A method for making a titanium nitride (TiN) layer used in manufacturing of a semiconductor device, comprising steps of:

forming the TiN layer out of source material, wherein the TiN layer contains impurities of carbon and oxygen atoms;

exposing the TiN layer to hydrogen plasma gas so that the hydrogen plasma gas reacts with carbon and oxygen atoms contained in the TiN layer and the carbon and oxygen atoms then emanate from the TiN layer and react with the hydrogen gas to form $CH_4$ and $H_2O$; and subsequently exposing the TiN layer to a nitrogen plasma gas so that vacancies, which are caused by the emanations of the carbon and oxygen atoms, are filled with nitrogen atoms;

wherein the step of exposing the TiN layer is carried out in a chamber having a temperature in a range of 200–500° C., a pressure in a range of 3–5 Torr, and a radio frequency power in a range of 200–700 W.

9. A method in accordance with claim 8, wherein a flow rate of the hydrogen plasma gas in the exposing step is 100–500 sccm.

10. A method in accordance with claim 8, wherein the step of exposing the TiN layer is performed for 10–60 seconds.

11. A method in accordance with claim 8, wherein the step of subsequently exposing the TiN using the nitrogen plasma gas is performed in the chamber having a second temperature in a range of 200–500° C., a second pressure in a range of 3–5 Torr, and a second radio frequency power in a range of 200–700 W.

12. A method in accordance with claim 8, wherein a flow rate of the nitrogen plasma gas in the subsequently exposing step is 100–500 sccm.

13. A method in accordance with claim 8, wherein the step of subsequently exposing the TiN layer is performed for 10–60 seconds.

14. A method in accordance with claim 8, wherein the source material is TDMAT or TDEAT.

15. A method for making a titanium nitride (TiN) layer used in manufacturing of a semiconductor device, comprising steps of:

forming a single TiN layer out of source material, wherein the TiN layer contains impurities of carbon atoms; and exposing the TiN layer to hydrogen and nitrogen plasma gases so that the hydrogen plasma gas reacts with the carbon atoms contained in the TiN layer, to form $CH_4$ from the carbon atoms which are emanated from the TiN layer, and enabling nitrogen atoms to occupy spaces left in the TiN layer by the emanation of the $CH_4$, thereby preventing oxygen ions from being absorbed into the TiN layer, wherein the step of exposing the TiN layer is carried out in a chamber having a temperature in a range of 200–500° C., a pressure in a range of 3–5 Torr, and a radio frequency power in a range of 200–700 W; and subsequently exposing the TiN layer using a second nitrogen plasma gas.

16. A method in accordance with claim 15, wherein the source material is TDMAT or TDEAT.

17. A method for making a titanium nitride (TiN) layer used in manufacturing of a semiconductor device, comprising steps of:

forming the TiN layer out of source material, wherein the TiN layer contains impurities of carbon atoms; and exposing the TiN layer to hydrogen plasma gas so that the hydrogen plasma gas reacts with carbon atoms contained in the TiN layer and the carbon atoms then emanate from the TiN layer and react with the hydrogen gas to form $CH_4$; and subsequently exposing the TiN layer to a nitrogen plasma gas so that vacancies, which are caused by the emanation of the carbon atoms, are filled with nitrogen atoms, wherein the step of exposing the TiN layer is carried out in a chamber having a temperature in a range of 200–500° C., a pressure in a range of 3–5 Torr, and a radio frequency power in a range of 200–700 W.

18. A method in accordance with claim 17, wherein the source material is TDMAT or TDEAT.

* * * * *